United States Patent [19]

Meunier et al.

[11] Patent Number: 4,823,083

[45] Date of Patent: Apr. 18, 1989

[54] INTEGRATED HEAD FOR THE MEASUREMENT OF MAGNETIC FIELDS AND METHOD OF MAKING THIS HEAD

[75] Inventors: Paul-Louis Meunier, Paris; Gerard Doriath, Palaiseau; Manijeh Razeghi, GYF-sur-Yvette, all of France

[73] Assignee: Thomson-CSF, Paris, France

[21] Appl. No.: 93,828

[22] Filed: Sep. 4, 1987

[30] Foreign Application Priority Data

Sep. 5, 1986 [FR] France .................... 86 12507

[51] Int. Cl.$^4$ ................ G01R 33/032; G01R 33/022; G02F 1/09
[52] U.S. Cl. .................... 324/244; 324/260; 350/377
[58] Field of Search ............. 324/244, 249, 260, 96; 350/374–378

[56] References Cited

U.S. PATENT DOCUMENTS 4,449,096 5/1984 Doriath et al. ............ 350/377 X
4,516,073 5/1985 Doriath et al. .............. 324/244

FOREIGN PATENT DOCUMENTS 0061743 10/1982 European Pat. Off. .
0130901 1/1985 European Pat. Off. .

OTHER PUBLICATIONS

Journal of Applied Physics, vol. 53, No. 11, Partie 2, Nov. 1982, pp. 8263–8265, American Institute of Physics, New York, US; G. Doriath et al., "A Sensitive and Compact Magnetometer using Faraday effect in YIG Waveguide", p. 8264, Magnetooptic Probe.

Primary Examiner—Gerard R. Strecker
Attorney, Agent, or Firm—Oblon, Fisher, Spivak, McClelland & Maier

[57] ABSTRACT

A magnetic field measuring head comprises the following elements integrated into one and the same substrate: a light source, a light guide insensitive to the magnetic field, a layer of magnetic material which, when plunged into a magnetic field to be measured, causes the rotation of the plane of polarization of the light coming from the source, and a device to measure the rotation of the plane of polarization of the light.

13 Claims, 2 Drawing Sheets

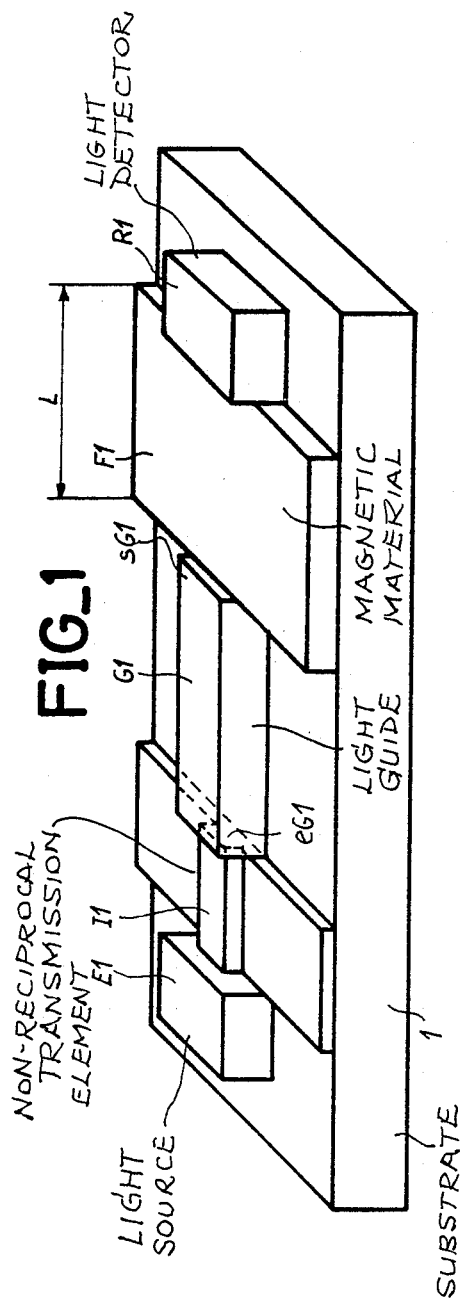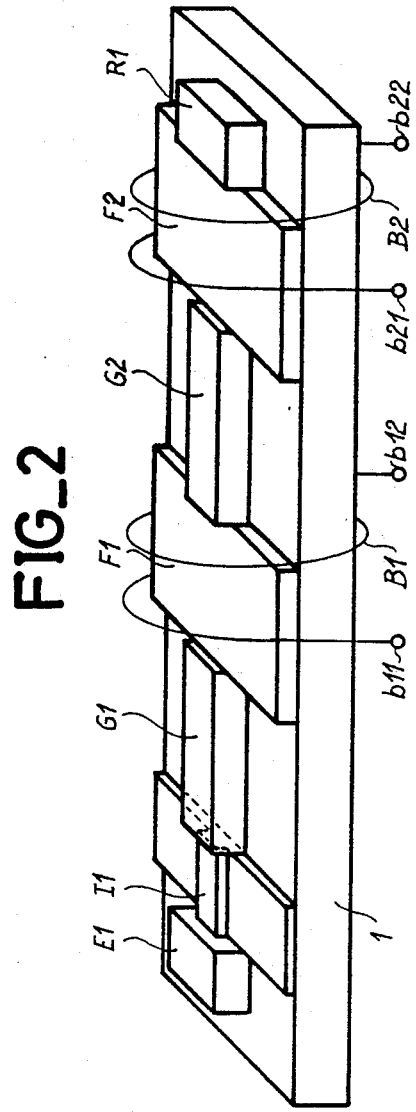

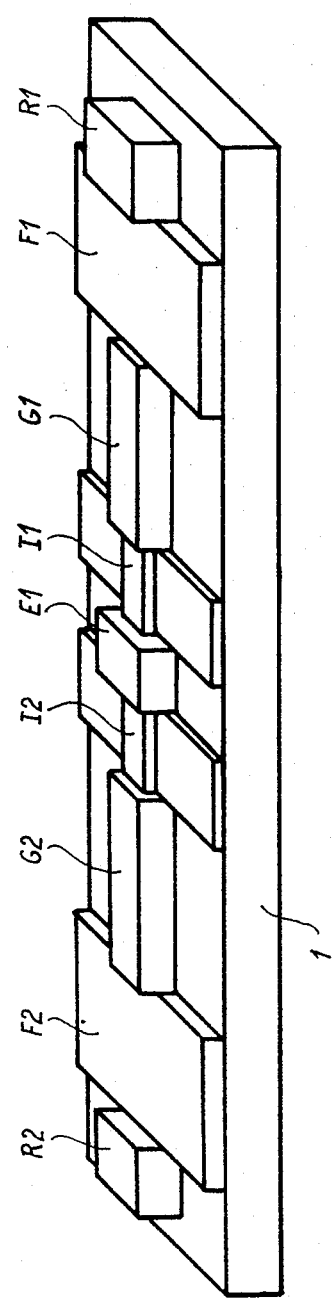
FIG_3

INTEGRATED HEAD FOR THE MEASUREMENT OF MAGNETIC FIELDS AND METHOD OF MAKING THIS HEAD

BACKGROUND OF THE INVENTION

1. Field of the Invention

The invention pertains to a head for the measurement of magnetic fields using the effect of the magnetic field on the polarization of light, a measuring head wherein the light source, the element sensitive to the magnetic field, the detector, any optical transmission element between the said elements as well as the electronics system for the processing of the detected signal are made monolithically on one and the same substrate. Depending on the embodiment, this measuring head can be applied to the measurement of magnetic fields or to the measurement of the gradient vector of magnetic fields.

The invention also pertains to a method of manufacture which can be used to make a head of this type.

2. Brief Description of the Prior Art

Prior art devices include measuring heads for magnetic field measuring instruments which use the influence of a magnetic field on the polarization of light to measure this magnetic field.

Thus, the French patent No. 76 18600 filed on 18th June 1976 and published under No. 2 355 299 on 13th Jan. 1978 describes an apparatus comprising:

A light source emitting a plane-polarized light beam;

A flat, thin layer of a magnetic material which is placed into the magnetic field to be measured and makes it possible to propagate the light beam in a guided manner;

A detector which receives the light beam after it has crossed the thin layer of magnetic material and which measures the light intensity of the beam.

The light beam is propagated in the thin layer in a single mode, TM for example. Because of the Faraday effect, the magnetic field causes the mode of propagation to be converted into the TE mode in a percentage that varies according to the value of the magnetic field. A rotation of the plane of polarization of the light is obtained and can be measured by the detector.

In another device of the prior art, described in the French patent No. 79 30721 filed on 14th Dec. 1979 and published under No 2 471 608 on 19th June 1981, and element propagating the light beam, placed in the magnetic field to be measured, is a thick layer of magnetic material used for a multimode light transmission. As above, because of the Faraday effect, the light beam experiences a rotation of its plane of polarization in the presence of a magnetic field. The rotation of this plane of polarization is brought about by means of crossed polarizers.

An arrangement of this type has been applied to the making of a device for measuring magnetic field gradients in the French patent application No. 83 11073 filed on 4th July 1983. In this device, two magnetic field measuring cells are placed on a single light beam. In this way, it is possible to measure a magnetic field gradient along a direction determined by the direction of the light beam. This patent also describes a system which can be used to measure the Faraday effect by means of a zero method using auxiliary windings that transmit a magnetic field cancelling the field to be measured.

However, the devices of the prior art are not made monolithically, and their design does not provide for an embodiment of this type. Consequently they take the shape of an association of hybrid components, a fact that raises two essential problems:

The performance characteristics of the components are difficult to reproduce;

The implanting of the components into one another calls for many precautionary measures.

The magnetic field measuring head of the invention and the method for making the said measuring head remove these disadvantages.

3. Summary of the Invention

Thus, an object of the invention is a magnetic field measuring head comprising:

a light source emitting a first beam of plane-polarized light;

a first flat layer of magnetic material placed in the path of the said light beam and placed into a magnetic field to be measured, the effect of which is to cause the rotation of the plane of polarization of the light;

first means to measure the rotation of the plane of polarization of the light, the said means being placed in the path of the said beam after it has crossed the layer of magnetic material;

a measuring head wherein the light sources and the layer of magnetic material are integrated into one and the same substrate and wherein they each possess a lattice parameter which is equal to or is a multiple or sub-multiple of the lattice constant of the substrate (1), the light source being coupled to the layer of magnetic material by a first light guide which is integrated into the said substrate and is insensitive to the magnetic field.

Another object of the invention is a method for making a measuring head of this type, a method comprising the following various, successive stages:

(a) A first stage for the machining, in a substrate, of a first light guide having a first end and a second end;

(b) A second stage for the masking of the said light guide made in this way;

(c) A third stage for the growth of a first layer of a ferrimagnetic material set at the second end of the said light guide;

(d) A fourth stage for the growth, on the substrate in a zone attached to the first end of the light guide, of an emitting diode made of a material having a lattice parameter which is substantially equal to or is a multiple or sub-multiple of the lattice constant of the substrate;

(e) A fifth stage for the growth, on the substrate in a zone attached to the first layer of ferrimagnetic material, of a receiving diode made of a material having a lattice parameter which is substantially equal to or is a multiple or sub-multiple of the lattice constant of the substrate;

(f) A sixth stage for making the processing circuits.

BRIEF DESCRIPTION OF THE DRAWINGS

The various objects and characteristics of the invention will become clearer from the following description which is made with reference to the appended figures, of which:

FIG. 1 shows a first embodiment of a measuring head according to the invention, applicable to the measurement of magnetic fields;

FIG. 2 shows an example of a second embodiment of a measuring head according to the invention, applicable to the measurement of magnetic field gradients;

FIG. 3 shows an alternative of the second embodiment of a measuring head according to the invention for the measurement of magnetic field gradients.

DETAILED DESCRIPTION OF THE INVENTION

Referring to FIG. 1, we shall first describe an embodiment of an integrated measuring head according to the invention, applicable to the measurement of magnetic fields.

Through the epitaxial growth of semi-conducting components on GGG or YIG, using low-pressure metalorganic chemical vapor deposition (LP-MOCVD), it is possible to achieve coexistence between a laser source and a light guide working at wavelengths ranging from 1.1 μm to 4.7 μm on one and the same substrate, hence to achieve total integration for any system requiring these two elements.

The invention pertains to a monolithic embodiment of a magnetic field detector. The source, the light guide, the element sensitive to the magnetic field, the detector and the output signal processing electronics system are built on the same support. Furthermore, the combination may include an insulator (monomode or multimode) between the source and the guide as shall be described further below, providing for the possibility high-purity transmission signals.

The epitaxial growth of III-V materials on GGG makes it possible to prepare a diode with the desired wavelength on a substrate comprising a light guide made of YIG for example. The sensitive part, which is the thin layer of YIG, with an optimized chemical composition (the substitution of Bi can be considered for example) or even a guide made of suitably doped YIG, is integrally joined to the light guide. Similarly, the receiving diode and its associated guide, from which the achieved signal is processed, may have the processing electronics system on the substrate.

In FIG. 1, we thus have a polarized light source E1, such as laser diode, on a substrate 1 made of an insulating material with characteristics which are insensitive to the magnetic field, a material such as a gadolinium-gallium-garnet GGG. This laser diode is made of a semi-conducting material with a lattice constant which is equal to or is a multiple or sub-multiple of the lattice constant of the material forming the substrate. Thus, this diode is quite suitable for implanting by a growth method using MOCVD.

The substrate is, for example, a gadolinium-gallium-garnet which has a lattice constant of 12.383 angstroms, and the laser diode may be made of elements of the groups III and V or II-VI of the periodic classification of elements. Furthermore, from the groups III-V, elements will be chosen which can be used to obtain laser transmission with a wavelength of about 1.3 microns to 1.5 microns. Thus, the material chosen will preferably be a composition of In Ga Al Sb, the lattice constant of which is 6.19 angstroms.

This laser diode emits a beam of polarized light towards a light guide G1. This light guide G1 is made of a material similar to that of the substrate 1, such that its physical characteristics make it insensitive to the magnetic field.

According to a preferred embodiment of the invention, this light guide is machined in the substrate 1 itself and is an integral part of it.

The light guide is made in the direction of the light beam emitted by the source E1 in such a way as to guide the said bema. It receives the light beam by a first and eG1 and re-transmits it at a second end sG1.

A thin layer of a magnetic material F1 is set on the substrate so as to receive the light beam transmitted by the guide G1 at the second end sG1.

This layer is made of a ferrimagnetic material with a lattice constant which is equal to or is a multiple or sub-multiple of the lattice parameter of the substrate, so that it can be made by epitaxial growth which makes it possible to obtain a thin layer of even thickness and perfect quality. To provide for monomode transmission in this layer, the thickness of the said layer will be in the range of a few micrometers.

Finally, depending on the direction of the light beam transmitted by the source E1, a light detector R1, such as a detecting diode, is set on the side opposite to the end sG1 with respect to the thin layer F1. This detector is made of a semi-conducting material with a lattice constant which is equal to or is a multiple of sub-multiple of the lattice constant of the substrate, so that it can be made by epitaxial growth as with the above elements.

Furthermore, to prevent stray reflections that might disturb the working of the light source E1, the invention provides for a non-reciprocal transmitting element I1 between the light source E1 and the light guide G1.

A non-reciprocal or insulating transmitting element of this type has been described in the French patent application No. 84 18928 filed on 11th Dec. 1984. It will be made, for example, of a ferrimagnetic material such as an yttrium-iron-garnet (YIG) with a lattice constant can be well adapted to that of the substrate 1, so that it can also be made by epitaxial growth. For this transmission element to be of the monomode type, both its width and its height will be in the range of a few micrometers, depending on the nature and, especially, on the refractive index of the materials framing the guide. Its length b will be a few millimeters for example.

While crossing the ferrimagnetic layer F1, the light beam emitted by the source E1 experiences a rotation of its plane of polarization owing to the Faraday effect caused by the prevailing magnetic field.

The measuring head described above can thus be used to detect a magnetic field at the position of the ferrimagnetic thin layer F1. The measurement is done along the length L of the distance covered. Since the light guide G1 is insenstivie to the magnetic field, the light beam is not influenced, in the said guide G1, by the magnetic field.

Furthermore, the light guide G1 makes it possible to shift the ferrimagnetic thin layer F1 aside from the light source E1 to prevent the current supply of the source E1 from setting up a magnetic field which might influence the thin layer F1. The distance between the source E1 and the layer F1 could be about 10 cm., for example, to provide the layer F1 with adequate insensitivity to all magnetic radiation from the source E1.

Although this is not shown in FIG. 1, the circuits that process the signals coming from the light detector R1 can be implanted in the substrate 1.

Similarly, FIG. 1 does not show the magnetic field induction devices (coils) which are provided for in the above-mentioned documents and which can be used to measure the rotation of the plane of polarization of the light with greater precision. As described in the documents referred to, these devices will be placed near the thin layer of ferrimagnetic material F1, in which occurs the rotation of the plane of polarization of the light to be measured.

Referring to FIG. 2, we shall now describe an embodiment of the measuring head according to the invention, applicable to the measurement of magnetic field gradients.

The measuring head of FIG. 2, repeats the elements of FIG. 1 with the same references. These elements are the light source E1, the non-reciprocal transmission element I1, the light guide G1, the thin layer of ferrimagnetic material F1 and the detector R1.

Between the layer of magnetic material F1 and the detector R1, there is a light guide G2 and a second thin layer of magnetic material F2, both these elements being placed in the path of the light beam emitted by the source E1.

The light guide G2 is made of a material with characteristics that make it insensitive to the influence of the magnetic field. Its design is similar to that of the light guide G1. For example, it is made of the same material as the substrate 1 and, according to a preferred embodiment of the invention, it is machined in the substrate 1.

The layer of magnetic material F2 is identical to the layer of magnetic material F1, barring manufacturing flaws. For example, it will be a few micrometers thick and will be made of a ferrimagnetic material such as an yttrium-iron-garnet which is epitaxially grown on the substrate 1.

Each ferrimagnetic thin layer F1 and F2 is placed inside a magnetic field induction device such as coils B1 and B2. These coils are supplied with current by input terminals b11, b12, b21 and b22. They are used to compensate for the ambient magnetic field prevailing at the position of each of the thin layers F1 and F2. The compensation is obtained when the detector R1 detects the same light intensity as that detected in the absence of the magnetic field. The difference between the currents given by the two coils B1 and B2 indicates the value of the magnetic field gradient vector at the position of th measuring head along a direction defined by the direction of the light beam given by the source E1.

FIG. 3 shows an alternative embodiment of the head shown in FIG. 2.

The elements of FIG. 3 which fulfil the same function as those of FIG. 2 bear the same references as in FIG. 2.

Unlike the head shown in FIG. 2, the head in figure 3 has its light guides G1 and G2 and its ferrimagnetic thin layers F1 and F2 set on either side of the light source E1 on the light beam emitted by the laser diode E1.

Consequently, between the light guide G2 and the source E1, there is provision for a non-reciprocal transmitting element I2. Furthermore, a detector R2 is associated with the ferrimagnetic layer F2 to detect the beam that comes from the source E1 and has crossed the ferrimagnetic layer F2.

The light beams emitted by the source E1 are co-linear. Each of them is transmitted to a ferrimagnetic thin layer F1, F2 and, depending on the value of the magnetic field prevailing at the location of each layer F1, F2, the light beam experiences a rotation of its plane of polarization. Each receiver R1, R2 detects the intensity of the light beam received and deduces therefrom the rotation of the plane of polarization of the beam. Processing circuits (not shown), which can also be implanted in the substrate, determine the difference between the results given by the detectors, to obtain the value of the magnetic field gradient vector according to the direction of the light beams at the position of the measuring head.

Magnetic field induction devices, similar to those of the head in FIG. 2, can also be provided. In this case, the measuring head of FIG. 3 will work in the same way as that of FIG. 2. For each of the induction devices will emit a magnetic field which will compensate for the magnetic field to be measured, in each thin layer F1, F2. Each detector R1, R2 will be used to ensure that the magnetic fields are adequately compensated for. Circuits (not shown) will be used to deduce, from the compensation fields given, the value of the gradient vector of the magnetic field to be measured.

We shall now describe a method for making the above-described heads. Firstly, we shall describe a method to make the head of FIG. 1.

In a first stage of the manufacturing methods, the light guide G1 is machined in a substrate 1 made of a non-magnetic material such as gadolinium-gallium-garnet (GGG). The length of this guide is about 10 cm. for example. Its height and width are about 3 micrometers and a few thousand angstroms respectively. But, in order not to be restrictive, dimensions of 3 micrometers by 3 micrometers may be considered.

In a second stage, the guide thus made is masked.

In a third stage, a layer of a ferrimagnetic material such as an yttrium-iron-garnet (YIG) is grown to a thickness of about a few micrometers for monomode light transmission in the layer thus made, or a thickness of a few tens tens of micrometers for a multimode transmission.

This process of growing the material is done by an epitaxial process, preferably by epitaxy using metalorganic chemical vapor deposition (MOCVD).

The layer of ferrimagnetic material is then machined so as to determine the limits of the propagation of light in the layer. The length will be in the range of a few mm. in the direction of propagation of the light beam, and the width will be about 1/10 mm.

In a fourth stage, a laser diode is grown in a zone neighbouring one end of the light guide, at a distance of less than one micrometer from this end, in such a wy that the laser diode emits along the direction of the guide G1.

The epitaxially grown material comprises elements of the groups III-V such as indium and arsenic or indium, gallium, aluminum and antimony with a lattice constant that has a ratio of 1:2 with respect to the lattice constant of gadolinium-gallium-garnet.

In the example of epitaxial growth using metalorganic chemical vapor deposition, the epitaxy is done at 450° to 700° Celsius under pressure ranging from 50 millibars to 500 millibars. For proper adaptation between the epitaxially grown material and the gadolinium-gallium-garnet, the depositing speed will preferably be between 20 angstroms and 300 angstroms per minute.

The laser diodes can also be grown by molecular beam epitaxy (MBE).

In a fifth stage, a receiving diode (R1) is also grown on the substrate, using a method similar to that of the fourth stage.

The fourth and fifth stages may be combined.

In a sixth stage, processing circuits are made on the substrate. These circuits are used to process the results of the detection performed by the receiving diode (R1).

To make a measuring head such as the one shown in FIG. 1, it is necessary to plan for a stage, at the end or after the third stage, for epitaxial growth in liquid phase of a layer of ferrimagnetic material such as an yttrium-iron-garnet (YIG) layer. This epitaxy is done at a temperature of about 980° Celsius.

The thickness of the layer made depends on the field in which the invention is to be applied. For example, for monomode guides, the YIG layer must be thin, a few microns for example, to give monomode characteristics to the transmission guides made in this layer. An epitaxial growth comprising several layers may also be considered.

For insulators of volume, the thickness of the layer may be greater than 20 times the wavelength emitted by the source.

The ferrimagnetic layer may also be made by cathode spraying, also known as sputtering, followed by an annealing operation.

Then, the non-reciprocal transmission elements are machined in the YIG layer. This machining is done, for example, by chemical machining using a concentrated orthophosphoric acid at a temperature ranging from 180° to 220° Celsius or by ionic machining. The guides made have the shape shown in FIG. 1.

In FIG. 1 the non-reciprocal transmission element is made up of a mesa section as shown. It can also be obtained by making a channel in the layer of magnetic material and by making a guide under the channel as described in the French patent application No. 84 18928 referred to above.

The invention also pertains to a method for making a measuring head which can be applied to the measurement of magnetic field gradient vectors. This method repeats the one described earlier. During the first stage, it provides for making two co-linear guides G1 and G2 with an empty space left between them.

To make the measuring head of FIG. 2, two ferrimagnetic material layers F1 and F2 are made during the third stage.

One of the layers (F1) is made between the two guides and the other (F2) is made at the end opposite to the guide G2 with respect to the guide G1.

Then, the non-reciprocal transmission element I1, the laser diode E1 and the receiving diode are made as described earlier.

To make the measuring head of FIG. 3, during the third stage, the two layers F1 and F2 are made at the ends of the guides G1 and G2 opposite to the empty space between these guides.

Finally, two non-reciprocal transmission elements I1 and I2 are made at the ends of the guides G1 and G2 in the space left between the guides.

During the fourth stage, the laser diode E1 is made between the two non-reciprocal transmission elements.

Finally, two receiving diodes R1 and R2, instead of a single one as described earlier, are made with each being associated with a layer of ferrimagnetic material F1, F2. Then the processing circuits, which process the results of the detection by the receiving diodes R1 and R2, are made on the substrate.

It is quite clear that the numerical values given in the preceding description have been given as examples, and that other values could be used to obtain the same results. Similarly, the types of materials used have been indicated only by way of example. Thus, a semi-conducting material comprising elements of the III-V groups has been considered, but it is also possible to envisage elements of the groups II-VI.

What is claimed is:

1. An integrated head for the measurement of magnetic fields, comprising:

a light source emitting a first beam of planepolarized light;

a first flat layer of magnetic material placed in the path of said light beam and placed into a magnetic field to be measured, wherein the plane of polarization of the light which enters said magnetic material layer placed in said path is rotated;

a first means to measure the rotation of the plane of polarization of the light, wherein said first means is placed in the path of said beam after same beam has cross said layer of magnetic material;

wherein said light source and said layer of magnetic material are integrated into one and the same substrate and wherein they each possess a lattice constant which is equal to or is a multiple or sub-multiple of the lattice constant of the substrate, and wherein said first means to measure the rotation of the plane is also located on said substrate, said light source being coupled to said layer of magnetic material by a first light guide which is integrated into said substrate and is insensitive to said magnetic field.

2. A measuring head according to the claim 1, also comprising a first non-reciprocal transmission element coupling the light source to the light guide.

3. A measuring head according to the claim 1, applicable to the measurement of magnetic field gradient vectors, further comprising a second thin layer of magnetic material placed between the first layer of magnetic material and the first measuring means.

4. A measuring head according to the claim 3, comprising a second light guide coupling the first layer of magnetic material with the second layer of magnetic material, and making it possible to transmit the light beam emitted by the light source.

5. A measuring head according to the claim 1, applicable to the measurement of magnetic field gradient vectors, wherein the light source emits a second light beam which is co-linear with the first one, but in an opposite direction, measuring head comprising second measuring means placed in the path of this second light beam, and a second layer of magnetic material placed in the path of this second beam between the light source and the second measuring means.

6. A measuring head according to the claim 5, comprising a second light guide integrated into the substrate and coupling the light source with the second layer of magnetic material.

7. A measuring head according to the claim 6, comprising a second non-reciprocal transmission element integrated into the substrate and coupling the light source with the second light guide.

8. A measuring head according to claim 1, wherein the thin layer or layers of magnetic material are integrated into the substrate.

9. A measuring head according to the claim 1, wherein the layer or layers of magnetic material are made of ferrimagnetic material.

10. A measuring head according to the claim 2, wherein the non-reciprocal element or elements are transmission guides made of ferrimagnetic material.

11. A measuring head according to the claim 9, wherein the ferrimagnetic material is a yttrium-iron-garnet.

12. A measuring head according to the claim 1, wherein the guide or guides are made of the same material as the substrate.

13. A measuring head according to the claim 12, wherein the substrate and the guide or guides are made of gadolinium-gallium-garnet.

* * * * *